United States Patent
Frutschy et al.

(10) Patent No.: US 6,469,893 B1
(45) Date of Patent: Oct. 22, 2002

(54) DIRECT HEATPIPE ATTACHMENT TO DIE USING CENTER POINT LOADING

(75) Inventors: Kris Frutschy; Ravi Prasher, both of Phoenix, AZ (US); Eric Distefano, Livermore, CA (US); Ajit Sathe, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/675,314

(22) Filed: Sep. 29, 2000

(51) Int. Cl.[7] ................................. H05K 7/20
(52) U.S. Cl. ............... 361/700; 165/80.2; 165/104.33; 174/15.2; 257/715; 257/719; 361/704
(58) Field of Search ............... 165/80.2, 80.3, 165/104.33, 185; 174/15.2, 16.3; 257/706–707, 712–713, 715–716, 718–719, 726–727; 361/704, 700, 687, 707, 709–710, 715, 719–720

(56) References Cited

U.S. PATENT DOCUMENTS

| | | | | |
|---|---|---|---|---|
| 5,307,236 A | * | 4/1994 | Rio et al. | 361/720 |
| 5,424,918 A | * | 6/1995 | Feips et al. | 361/704 |
| 5,549,155 A | * | 8/1996 | Meyer, IV et al. | 257/718 |

* cited by examiner

*Primary Examiner*—Gregory Thompson
(74) *Attorney, Agent, or Firm*—Blakely, Sokoloff, Taylor & Zafman LLP

(57) ABSTRACT

An apparatus that includes a number of stacked computer components such as a vapor chamber, and a centerpoint force, wherein the centerpoint force is applied to the vapor chamber.

41 Claims, 7 Drawing Sheets

DIRECT HEATPIPE ATTACHMENT TO DIE USING CENTER POINT LOADING

BACKGROUND OF THE INVENTION

1. Field of the Invention

The present invention relates to the field of computer component assembly and in particular to an assembly of a die to a heat conductor.

2. Discussion of Related Art

In the design and manufacture of computer hardware, meeting certain thermal requirements can be essential. In particular a silicon microchip (die) placed into a circuit package, can have a requirement to remove heat generated by the microchip during operation. The circuit package may have a barrier of plastic covering the die. In the case of laptop computers, a heatpipe acting as a heat conductor may be attached to the circuit package containing the die to help carry off the heat. As illustrated in FIGS. 1a and 1b, the heatpipe 116 can have a metal part called a spreader plate 104 that is placed between the circuit package 110 and the heatpipe 116 to thermally mate the smaller heatpipe contact area to the circuit package 110. The heatpipe 116, circuit package, 110, and spreader plate 104 are clamped to a printed circuit board substrate (substrate) 112 using several fasteners 102. The clamping process can places unequal forces (loads) F1 & F2 (only two fasteners are shown for clarity but four or more fasteners may be used) on the heatpipe 116 and spreader plate 104. There can potentially be as many unequal forces applied as there are fasteners 102. As a result, some of the computer components (heatpipe 116, spreader plate 104, circuit package 110) may flex and/or shift. With movement of the computer components 116, 104, 110, thermal interface materials 108, 114 placed between the heatpipe 116 and the spreader plate 104 and between the spreader plate 104 and the circuit package 110 may take on a varying thickness. A varied thickness in the thermal interface materials 108, 114 as well as an increase in thermal interface material 108, 114 thickness will both increase thermal resistance.

Illustrated in FIGS. 1a, 1b, and 1c is an apparatus to provide the clamping force using fasteners 102 such as screws or bolts. These fasteners 102 connect the spreader plate 104 to the substrate 112 with the circuit package 110 in between. Each fastener 102 applies a force (F1, F2) that contributes to the total clamping force (F1+F2). The spreader plate 104 and the substrate 112 place in compression a first thermal interface material (TIM 1) 108, the circuit package 110, and a second thermal interface material (TIM 2) 114. Even small differences in the dimensions of the spreader plate 104 or the circuit package 110 or in the torque applied 113 to each fastener 102 is sufficient to cause one fastener 102 to have a force different F1≠F2 from the other fasteners 102. As a result, the spreader plate 104 may tilt (FIG. 1b) and the thermal interface materials 108, 114 can each take on a varying thickness. In addition, if the forces (F1, F2) applied are too great for the spreader plate 104 stiffness, the spreader plate 104 may bow (FIGS. 1a & 1c). If the spreader plate 104 is sufficiently stiff, the spreader plate 104 may tilt as a result of the unequal forces F1, F2 (FIG. 1b). Both bending and tilting of the spreader plate 104 are simultaneously possible with the result that TIM 1 108 can flow in response thereby creating a non-uniform TIM 1 108 thickness. The second thermal interface material (TIM 2) 114, positioned between the spreader plate 104 and the heatpipe 116, is outside the clamping force (F1+F2) but can still flow in response to the movement of the spreader plate 104, with the result of a non-uniform TIM 2 114 thickness. The consequence of non-uniform TIM 108, 114 thicknesses is reduced performance because of a local and/or overall temperature increase in the circuit package 110.

Additionally, in response to these unequal loads (F1, F2), TIM 1 108 and TIM 2 114 may develop voids, and TIM 1 108 and TIM 2 114 may separate from the spreader plate 104 and/or the heatpipe 116. As a result, an increase in the thermal resistance recurred by TIM 1 108 and TIM 2 114 on to thickness differences and voids/separations can occur.

Connecting the spreader plate 104 to the heatpipe 116 may be accomplished without a thermal interface material by using a close fit of the components such as an interference fit that requires tight dimensional tolerances between mating surfaces. To minimize thermal resistance, close direct contact is required to avoid air gaps between the two mating parts. Alternatively, the connection may be accomplished with the thermal interface material between the heatpipe 116 and the spreader plate 104. The thermal interface material (TIM) should also be thermally conductive and may be a grease, a solder, selected from a range of adhesives, or other materials. The interface dimensions, the thermal interface material, and a method of holding the computer components in a stacked position (stack), are important.

When an adhesive or solder is used as the thermal interface material, and bond strength is required, proper assembly force is necessary to ensure good bond strength. If no bond strength is required, a thermal interface material may be used that does not set up as do the adhesives and solders. However, regardless of whether a TIM sets up like an adhesive or does not set up such as with a grease, during the time the TIM can flow or deform requires the thickness to be controlled as well as the creation of gaps and voids to be minimized. Such voids may exist within the TIM and gaps can exist at the TIM surfaces. Additionally, the thickness of the material may be applied unevenly. As a result, heat conduction through the material and interface surfaces will be less efficient.

BRIEF DESCRIPTION OF THE DRAWINGS

FIG. 3 is an illustration of a spring clip, the backing plate, the thermal interface material, and computer components in between;

DETAILED DESCRIPTION OF THE PRESENT INVENTION

Figure 1A:
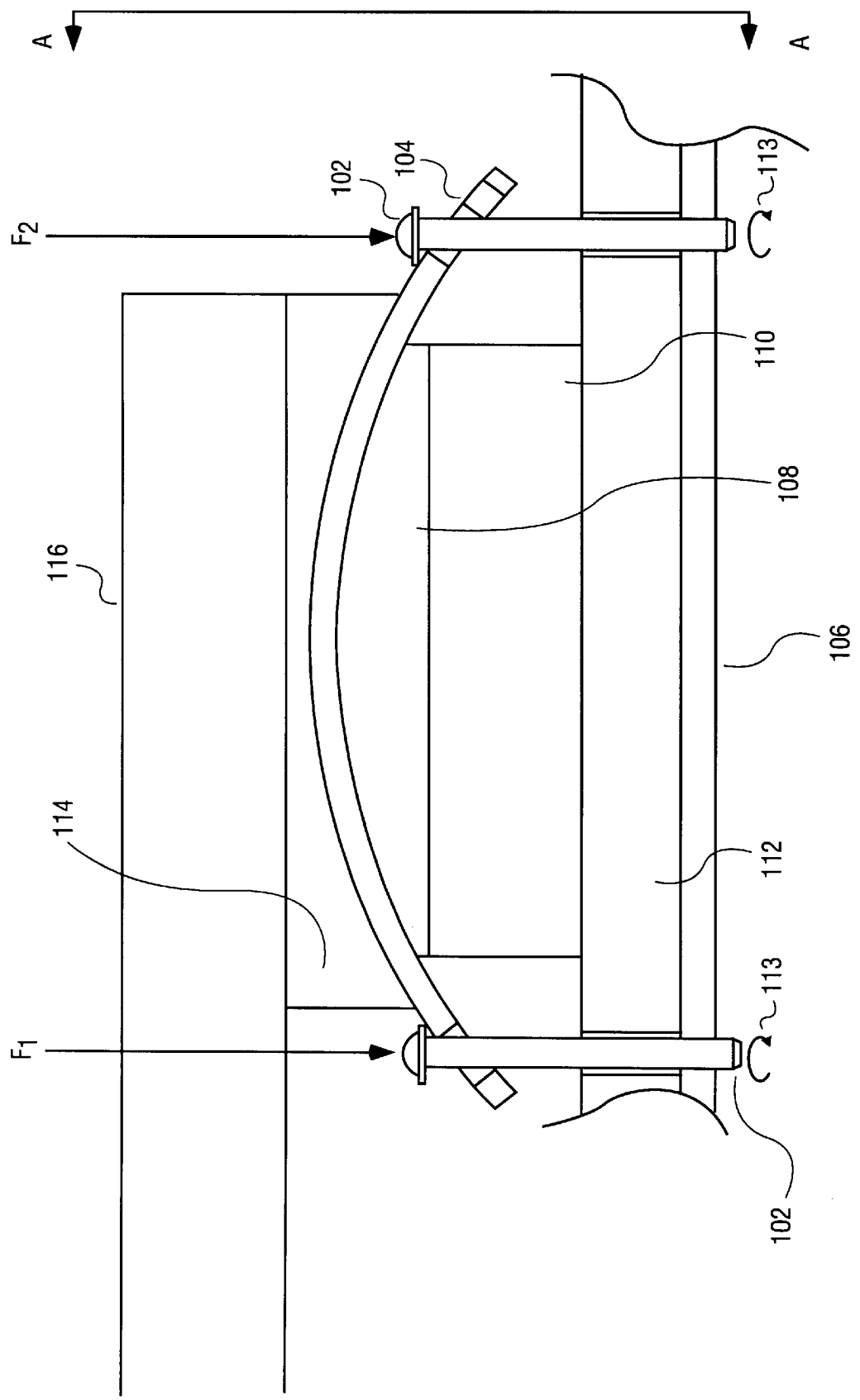
FIG. 1a is an illustration of a bowed spreader plate.
Figure 1B:
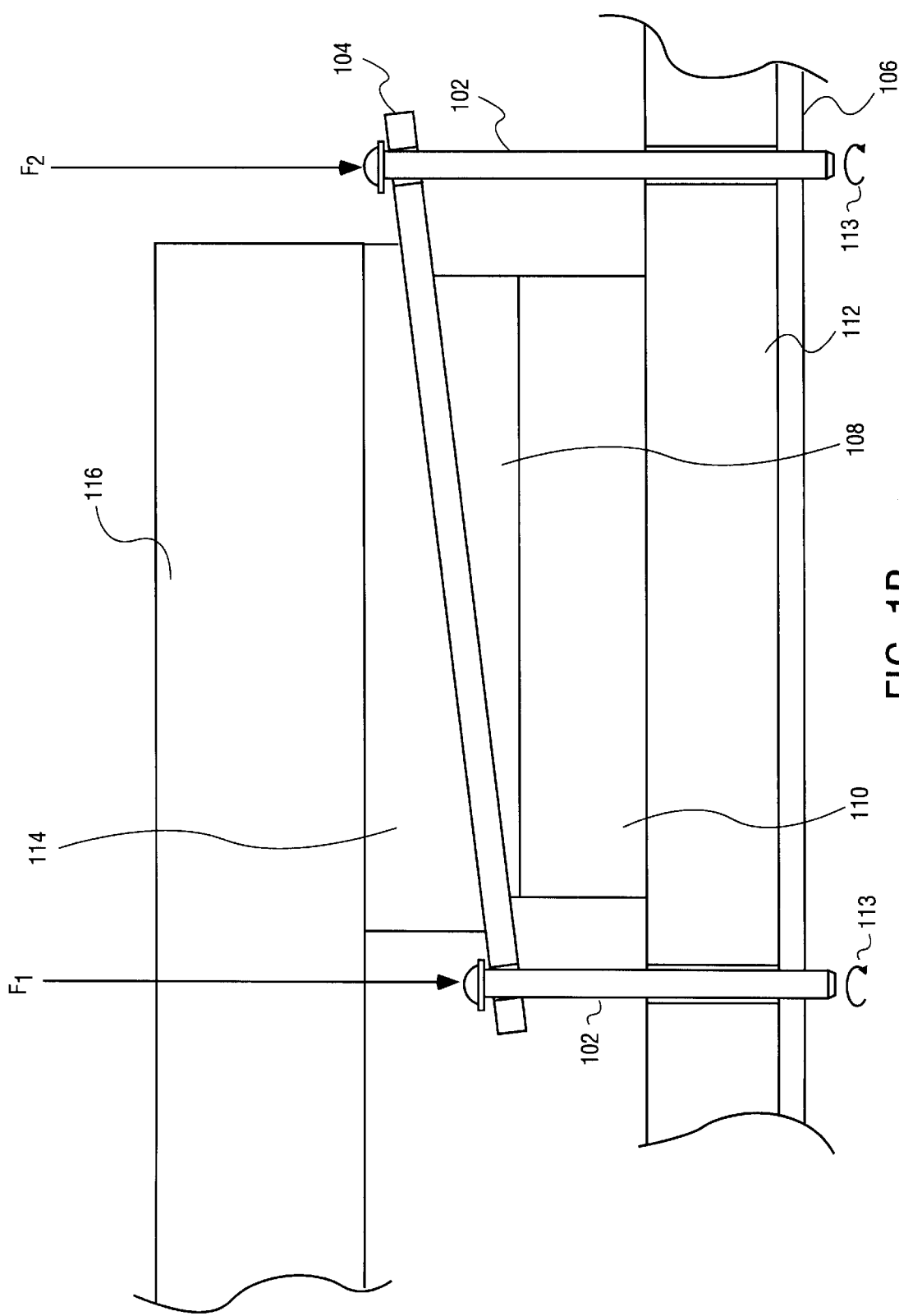
FIG. 1b is an illustration of a tilted spreader plate.
Figure 1C:
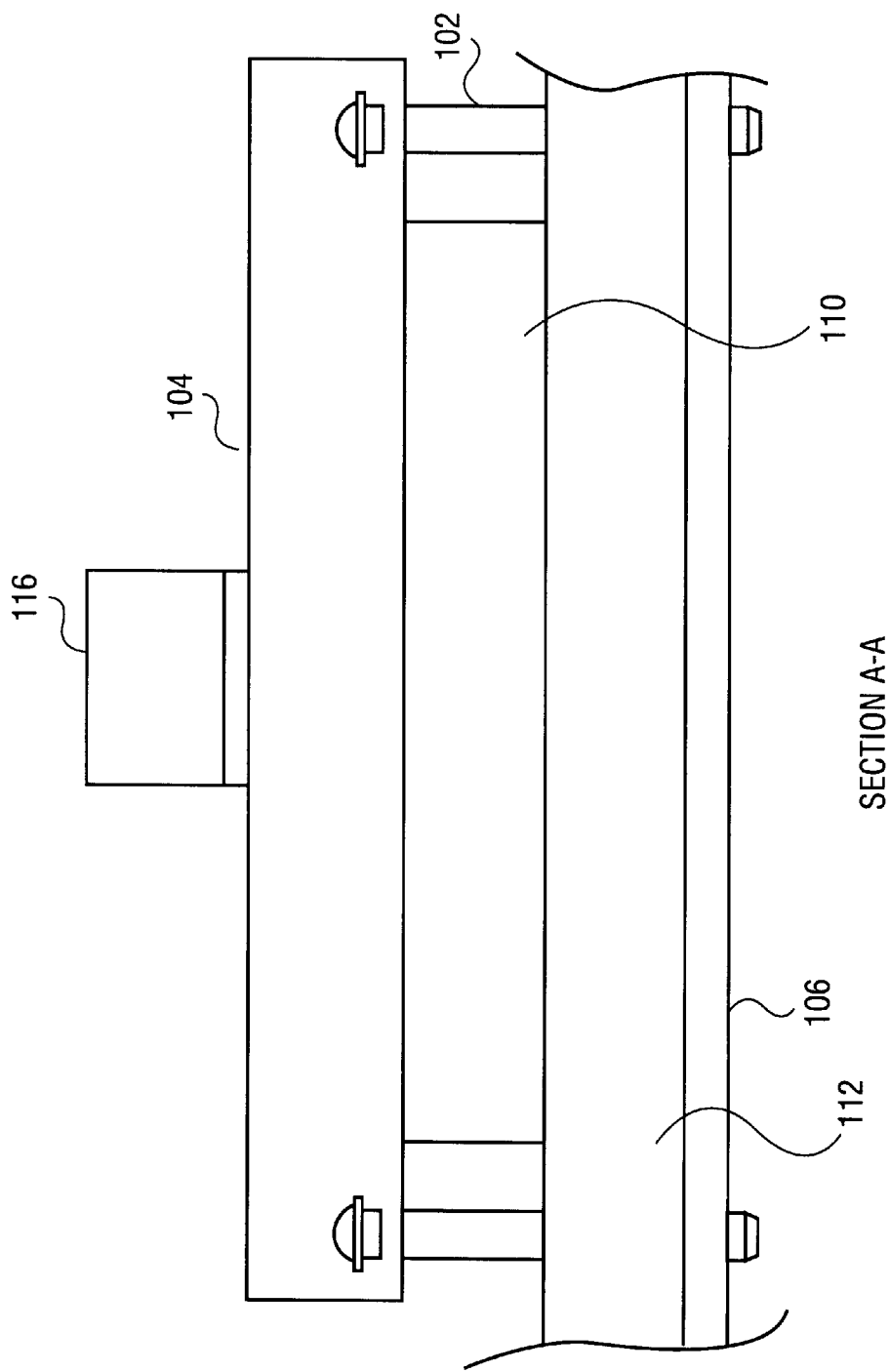
FIG. 1c is an illustration of an end view of a bowed spreader plate.

A novel structure and method for providing a balanced clamping force to a vapor chamber directly attached to a die or a circuit package is disclosed. In the following description numerous specific details are set forth such as specific materials, equipment, and processes in order to provide a thorough understanding of the present invention. In other instances, well known computer assembly techniques and machinery have not been set forth in detail in order to minimize obscuring the present invention.

A heatpipe is a heat transfer structure that includes a number of channels for transferring heat to a condenser region. Each heatpipe is composed of a central vapor channel with a number of parallel capillary channels, each of which is open on one side to the vapor channel thereby serving as the wick of the heat pipe, running the length of the circuit board to a condenser region. The heat from the microchip vaporizes a working fluid in the capillaries and the vapor, in turn, travels in the vapor channel to a condenser region to be cooled and condensed by a cooling medium, such as air, over this region.

When a heatpipe is used, a heatpipe surface contacting the circuit package typically has a cross-section smaller than the circuit package it contacts and a portion of the circuit package extends out beyond the heatpipe edges. As a result, heat transfer may not be as efficient as required and a thermal adaptor such as a spreader plate can be used. To improve thermal conduction between the heatpipe and the circuit package, the spreader plate has a surface area and shape that can more closely match with the heatpipe. The spreader plate is positioned between the heatpipe and the circuit package.

A type of heatpipe known as a vapor chamber functions like the heatpipe but is manufactured differently. The vapor chamber is machined in two parts and then mated or "clam shelled"together to form the completed vapor chamber. With this manufacturing method, that makes more use of machining techniques, a wider and stiffer heat conductor is possible than is available with the heatpipe. As a result, in particular for portable computers, the need for a spreader plate may not be necessary and the vapor chamber may be connected directly to an individual die. With this approach, the vapor chamber is not separated from the die by a plastic layer of the circuit package that could act as a thermal barrier and the vapor chamber can directly conduct heat off the die surface. A heatpipe could also serve this purpose if it is wide enough and stiff enough.

The present invention is a novel structure and method for directly attaching a vapor chamber to the die or the circuit package having a single thermal interface material in between. In addition, the present invention is a novel structure and method to fabricate uniform thermal interface material thicknesses having minimal voids and gaps by providing a centered point force (centerpoint force) that results in a balanced clamping force.

Figure 2A:
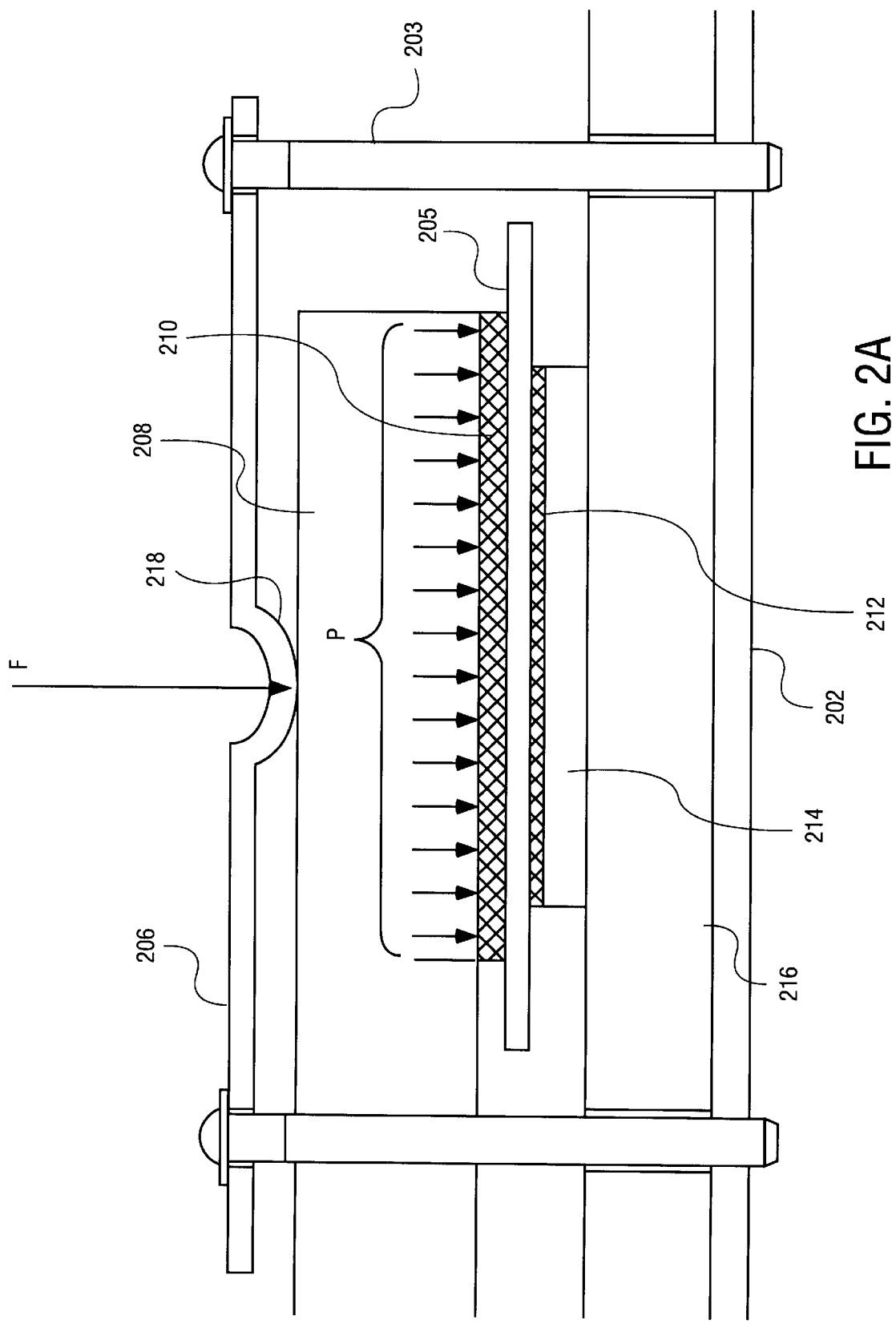
FIG. 2a is an illustration of a bracket, a heatpipe, the spreader plate, thermal interface materials, computer components, and a backing plate.

Turning to FIG. 2a, is an illustration of a clamping apparatus where a spreader plate 205, heatpipe 208, and two thermal interface materials 210, 212 are used. Uniform thermal interface material thicknesses are obtained by applying a centered point force F to the heatpipe 208. Positioned in between the circuit package 214 and the spreader plate 205 is a first thermal interface material (TIM 1) 212. Positioned in between the spreader plate 205 and the heatpipe is the second thermal interface TIM 2 210 material. The thermal interface materials 210, 212 can have physical characteristics that may allow TIM 1 or TIM 2 to move or flow in response to uneven forces applied. The center point force F is generated with a backing plate 202 on one side fastened 203 to a bracket 206 that together apply a clamping force to the stack of heatpipe 208, spreader plate 205, thermal interface materials 210, 212, and substrate 216. The center point force is applied locally to the heatpipe 208 by the bracket 206 through a raised area 218 centered such as to apply a balanced force P to the circuit package 214 in between. The balanced center point force F is a force applied over a small enough area to be considered a single point load F with the load applied to the heatpipe 208 and centered over the circuit package 214. In this manner, the centerpoint force F provides a uniform clamping pressure P to the circuit package 214 and the thermal interface materials 210, 214.

Figure 2B:
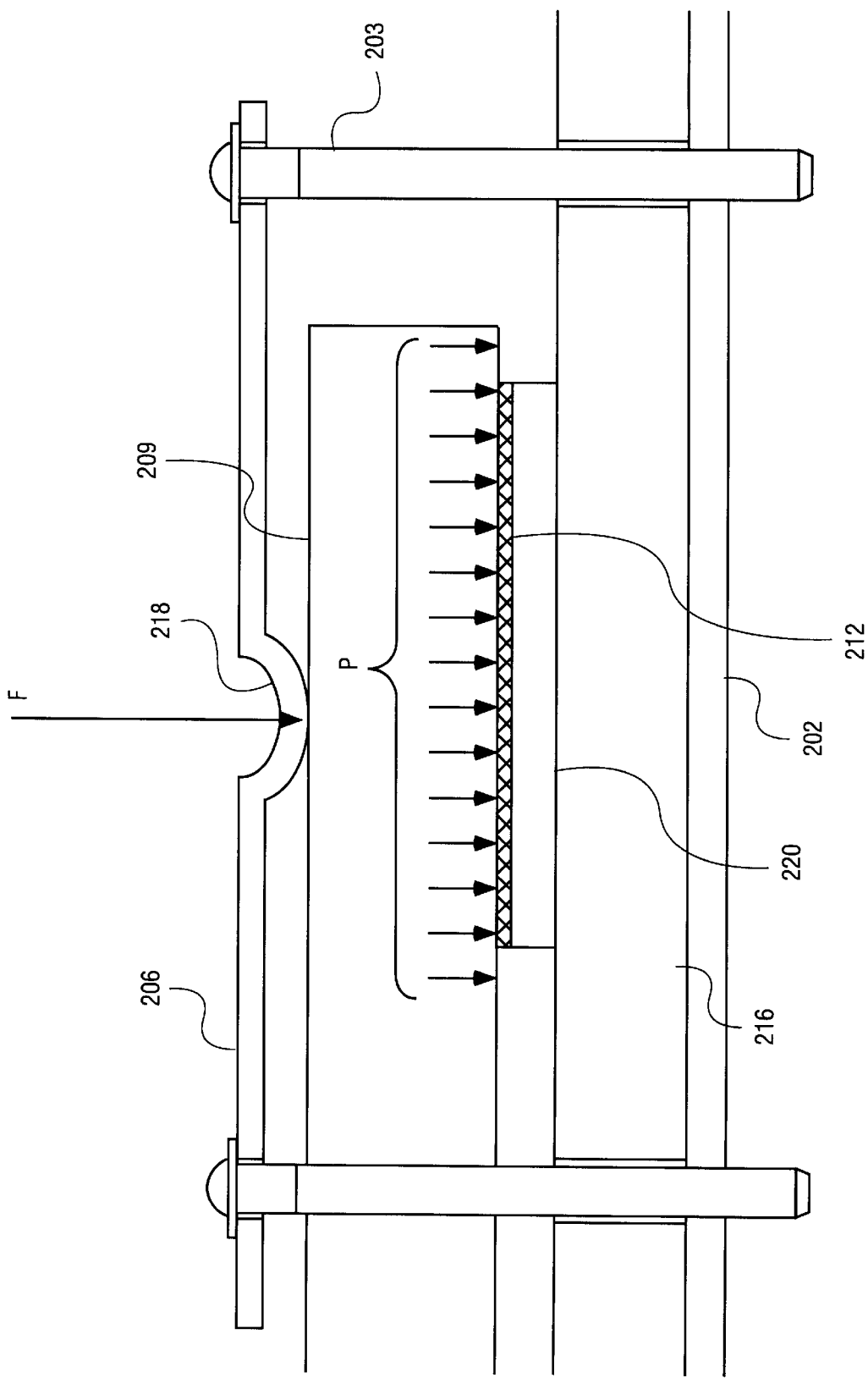
FIG. 2b is an illustration of a bracket, a vapor chamber, thermal interface material, computer components, and the backing plate.

Turning to FIG. 2b, is seen an illustration of a center point force F applied to a vapor chamber 209, a thermal interface material (TIM) 212, and a die 220. By eliminating the use of a spreader plate 205 (FIG. 2a), it is possible to eliminate one thermal interface material and one interfacial contact surface. The interfacial contact surface is a surface that transitions from one material to another. Both the additional interfacial contact surface and the additional thermal interface material will increase thermal resistance.

Again, the centerpoint force F is applied with the bracket 206 and the backing plate 202 using fasteners 203. The vapor chamber 209 is free to pivot and remain parallel to the die 220 which can maintain a uniform thermal interface material thickness 212. The central point force F is applied to the vapor chamber 209 made stiff enough to resist warping under the center point force F. As a result, the center point force F is applied to the vapor chamber 209 and a uniform clamping pressure P is applied to the die 220.

To ensure uniform TIM 212 thickness, the thermal interface material 212 should be applied at a uniform thickness. However, slight variations in the TIM 212 thickness as applied may be acceptable if the TIM 212 has material properties such that the TIM 212 can flow as a result of the center point force F until a uniform thickness is achieved.

TIM 2 210 material choices for the design using the spreader plate 205 (FIG. 2a) can include many adequate thermal conductors such as; epoxy adhesives, a thermal grease, or a solder. Alternatively, the press fit providing a firm and flat contact may be used between the spreader plate and the heatpipe instead of a thermal interface material. TIMs for both the spreader plate design (FIG. 2a) and the direct vapor chamber attachment design (FIG. 2b) can use a phase change thermal interface material. The phase change thermal interface material can be a material such as Thermflow™ T454 (Chomerics, a div. of Parker Hannifin, Woburn, Mass.). T454 is a thermally conductive, electrically non-conductive, dry film that softens at device operating temperatures resulting in a "grease-like"performance. T454 can be used as a pad between the spreader plate 205 and the circuit package 214 (FIG. 2a) or between the vapor chamber 209 and the die 220 (FIG. 2b). T454 can be obtained with a uniform thickness of 0.13 mm. The uniformly thin T454 material, if properly applied to maintain its uniform thickness, minimizes thermal resistance.

Figure 3:
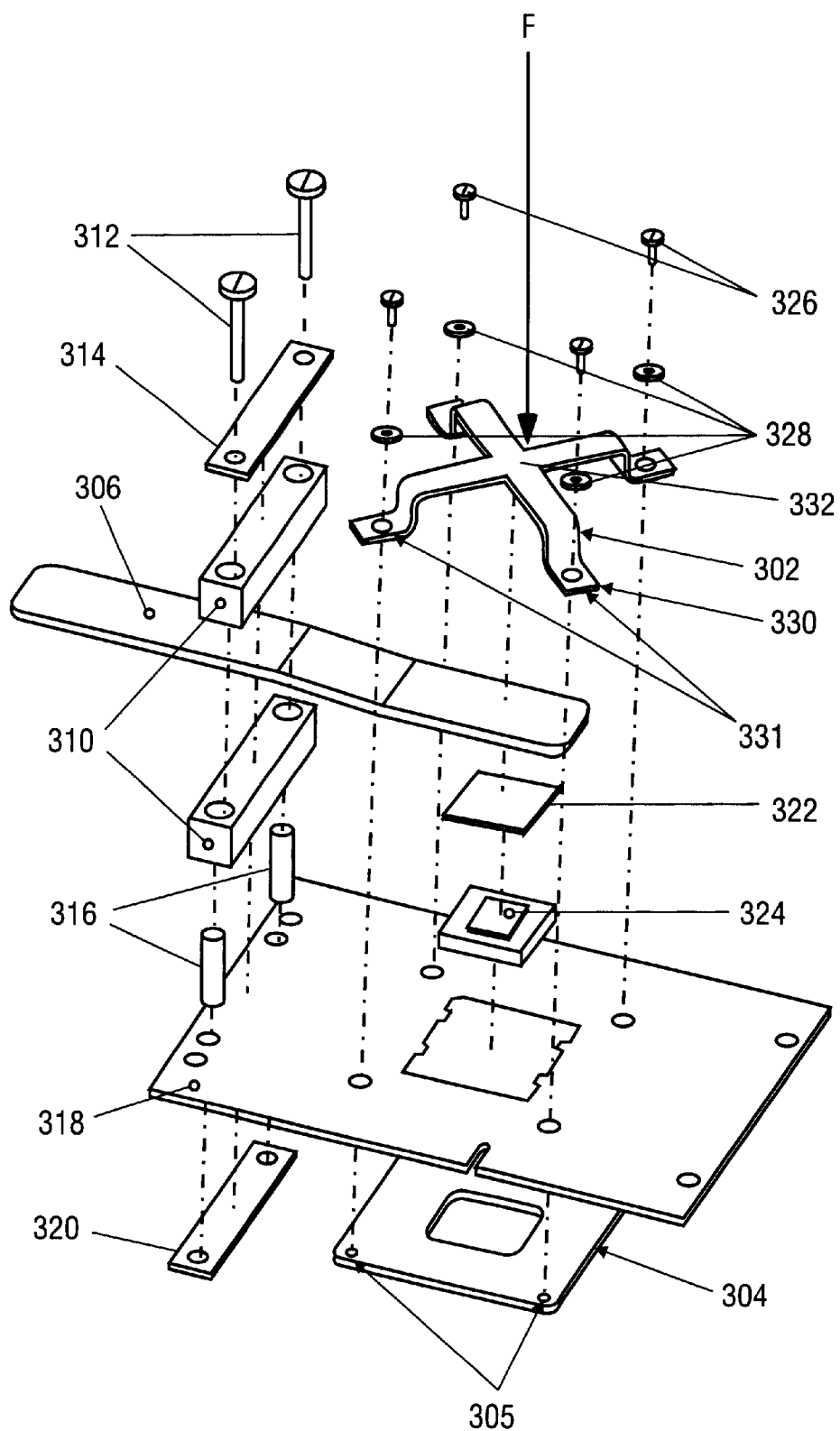

In an embodiment as illustrated in FIG. 3, a bracket 330 acting as a spring, called a spring clip 330, is fastened to a backing plate 304 with the vapor chamber 306, die 324, printed circuit board substrate (substrate) 318, and thermal interface material 322 in between. The spring clip 330 has through-holes 331 and the backing plate 304 threaded holes 305 wherein screws 326 are threaded and a center point force F is applied to the vapor chamber 306 by a raised area 332 on the spring clip . The raised area 332 is positioned to create a balanced clamping or compressive force on the sandwiched or stacked vapor chamber 306/thermal interface material 322/die 324/substrate 318.

The spring clip, backing plate apparatus (apparatus) 302, 304 as illustrated in FIG. 3 reacts on the stack of computer components (vapor chamber 306, thermal interface material 322, die 324, & substrate 318), the computer components sandwiched between the spring clip 302 and the backing plate 304. The total clamping force F applied is approximately 15 pounds. The spring clip 302 is made of spring steel, and along with the "spider-like"shape combine to create a spring response in the spring clip 302. With the spring clip 302 acting as a spring, as long as the spring clip 302 has some deflection (as a result of contact with the raised area) when installed, and the deflection stays within an acceptable range of spring response, the force applied to the stack can be a constant regardless of the amount of deflection. The use of the spring can simplify assembly procedures for installation of the apparatus 302, 304. Such a simplified assembly process may allow broader dimensional tolerancing of the apparatus 302, 304 and computer components 306, 324, 318 and eliminate a need to determine the center point force F applied to each stack of computer components 306, 322, 324, 318 during assembly such as with an added quality test.

Positioned beneath the spring clip 302 is a vapor chamber 306 such as may be manufactured by Thermacore, Inc. (Lancaster, Pa.). The vapor chamber 306 can have a length of approximately 150 mm, a width of approximately 20 mm, and a thickness of approximately 3 mm.

The vapor chamber 306 is supported at one end by the stack of computer components 306, 322, 324, 318 sandwiched between the assembly 302, 304 and at the other end by a pair of foam blocks 310. Retaining the foam blocks 310 are a pair of bolts 312 that first pass through a pair of through holes in a top bracket 314, next through a pair of holes in the first foam block 310, pass around the heatpipe 306, through a pair of holes in the second foam block 310, through a pair of standoff tubes 316, through a pair of holes in the printed circuit board substrate 318, finally to thread into threaded holes 305 in the backing plate 320.

Within the stack of computer components 306, 322, 324, 318 and positioned beneath the vapor chamber 306 is the T454 thermal interface material pad (pad) 322 while beneath the pad 322 is the die 324 connected to the printed circuit board substrate 318. Beneath the printed circuit board substrate 318 is positioned the backing plate 304. Upon assembly, the spring clip 302 is placed over an end of the vapor chamber 306 resting on the pad 322. The spring clip 302 is then fastened with four screws 326 and washers 328, the screws 326 pass through holes in the printed circuit board substrate 318 to thread into threaded holes 305 in the backing plate 304. The screws 326 may be tightened until the feet 330 of the spring clip 302 lie flat against the printed circuit board substrate 318 with the spring clip 302 flexing slightly due to interference at the raised area 332 (shown as location only, raised area exists on the opposite side) in the center of the spring clip 302. The screws 326 may be bonded in place with an epoxy adhesive (not shown).

Assembly may begin with the die 324 mounted onto the printed circuit board 318. The vapor chamber 306 support structure: the top and bottom brackets 314,320, the foam blocks 310, bolts 312, and standoff tubes 316 are loosely assembled. The pad 322 is placed on the die 324 and the heatpipe 306 positioned above the pad 322 and loosely resting between the two foam blocks 310. The spring clip 302 is placed over the vapor chamber 306 with the raised area 332 (shown for location only, raised area is on the other side of the spring clip 306) resting at a point chosen on the vapor chamber 206 to apply the center point load F. The backing place 304 is positioned beneath the printed circuit board substrate 318 and the screws 326 are threaded in place. Finally, the bolts 312 are tightened to position the foam blocks 310 that support the vapor chamber 306 end opposite the stack.

The vapor chamber 306, such as a vapor chamber made by Thermacore, Inc. (Lancaster, Pa.) is positioned beneath the spring clip 302. The central point load F is applied by the spring clip 302 to a point on the vapor chamber 306 that is centered over the die 324. The vapor chamber 306, loosely held at the opposite end by the foam support blocks 310, is still free to pivot in all planes to distribute loads evenly.

Located between the vapor chamber 206 and the die 202 is the low thermal resistance interface pad (pad) 222 that is 0.7"×0.7"×0.005"in size. The pad 222 may be made from a phase change material such as T-454, which combines the consistency and ease of use of elastomeric pads with the low thermal impedance of thermal grease.

Positioned beneath the printed circuit board substrate 318 is the backing plate 304 that accepts screws 326 passing from the spring clip 302 through the printed circuit board substrate 318. To limit the bolts 312 and screws 326 from "backing out"of the threads, locking washers or an adhesive may be used to hold the bolts 312 and screws 326 in place. The screws 326 may be bonded into the backing plate 304 threads or bonded at the screw head 326/washer 328/spring clip 302 interfaces.

Figure 4C:
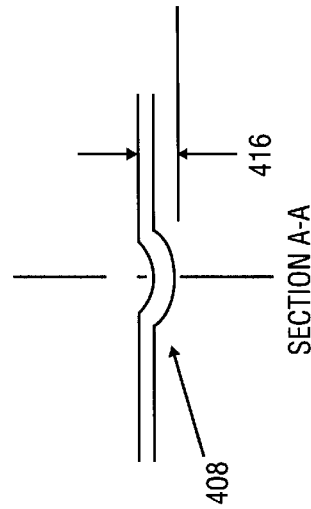
FIG. 4c is an illustration of a cross-section of a raised area on the spring clip.
Figure 4B:
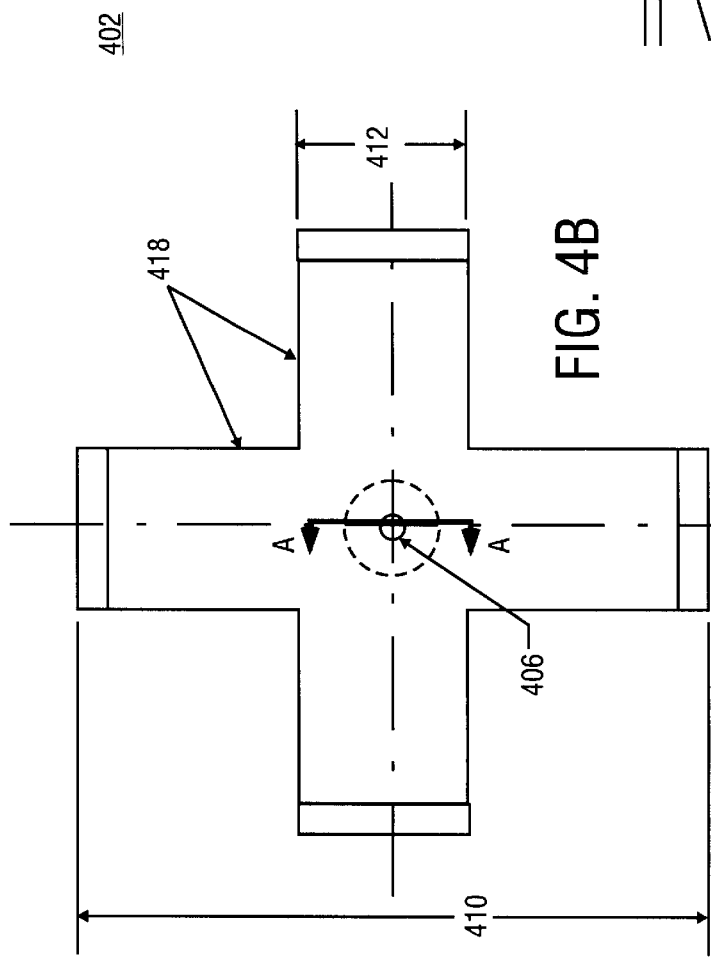
FIG. 4b is an illustration of a side view of the spring clip.
Figure 4A:
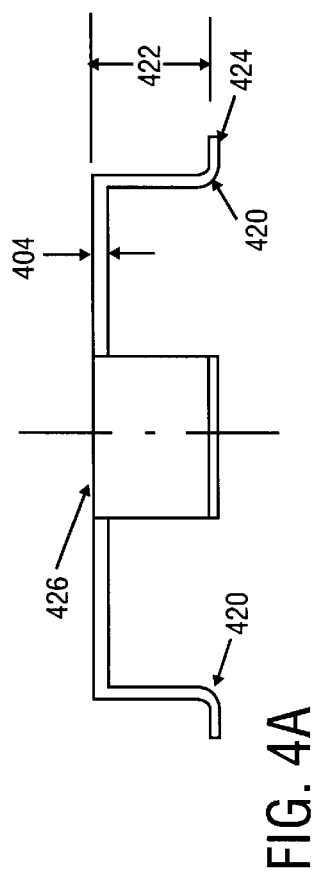
FIG. 4a is an illustration of a top view of the spring clip.

Illustrated in FIGS. 4a, 4b, and 4c, the spring clip 402 can be formed from 1.5 mm thick 404 spring steel sheet stock. The spring clip 402 may first be stamped from a pattern and then bent to shape. The stamping operation may form a flat outline, punch out the holes and a center depression 406, the depression 406 to raise a "dimple"or raised surface 408 on the opposite side that can apply the single-point load. The spring clip 402 overall dimension is approximately 70 mm 410 square, with each leg width 412 approximately 8 mm. The raised area 408 at the spring clip 402 center has a radius in the approximate range of 1–12 mm, the legs 418 of the spring clip are bonded with an approximate 400 mm outer radius 420.

We claim:

1. An apparatus, comprising:
   a backing plate,
   a bracket having a raised area,
   a plurality of fasteners connecting the backing plate with the bracket, and
   a plurality of stacked computer components comprising;
   a heatpipe, wherein a centerpoint Force is applied to the plurality of stacked computer components by the raised area that places the plurality of stacked computer components in compression.

2. The apparatus of claim 1, further comprising:
   a die having a die surface, wherein the centerpoint force provides a uniform pressure applied to the die surface.

3. The apparatus of claim 1, further comprising:
   a circuit package having a surface, wherein the centerpoint force provides a uniform pressure applied to the circuit package surface.

4. An apparatus, comprising:
   a bracket having a raised area;
   a backing plate; with
   a plurality of computer components in between wherein one of the computer components is a heatpipe; and
   one or more attachment features wherein the bracket is attached to the backing plate with the raised area of the bracket providing a center point force to the heatpipe to clamp the plurality of computer components together.

5. The apparatus of claim 4, wherein the raised area is a radius.

6. The apparatus of claim 5, wherein the radius is a range of 2–4 mm.

7. The apparatus of claim 4, wherein the raised area is a flat surface.

8. The apparatus of claim 4, wherein the bracket flexes as a spring.

9. The apparatus of claim 4, further comprising:
a plurality of bracket through holes; aligned with a plurality of backing plate threaded holes; and
the one or more attachment features are fasteners.

10. The apparatus of claim 9, further comprising:
the bracket flexes as a spring;
the bracket has one or more edges; and
the plurality of bracket through holes are located near the one or more edges.

11. The apparatus of claim 4, wherein the heatpipe is a vapor chamber.

12. The apparatus of claim 11, wherein the vapor chamber resists distortion as a result of the centerpoint force applied.

13. The apparatus of claim 11, further comprising:
a pair of foam blocks supporting the vapor chamber with a clamping force at an end opposite the end clamped by the bracket wherein the clamping force is low compared to the centerpoint force.

14. The apparatus of claim 4, wherein the items further comprise:
a die,
a first thermal interface material; and
the raised area is centered over the die.

15. The apparatus of claim 14, wherein the items further comprise:
a spreader plate, and
a second thermal interface material.

16. An apparatus, comprising:
a bracket having a raised area;
a backing plate;
a plurality of computer components, including a heatpipe, in between; and
means for applying a balanced clamping force through the raised area, to the plurality of computer components.

17. The apparatus of claim 16, further comprising:
one or more thermal interface materials are positioned between the plurality of computer components.

18. The apparatus of claim 17, wherein the bracket is a flexible spring.

19. The apparatus of claim 16 wherein, one of the plurality of computer components is a spreader plate.

20. The apparatus of claim 19, wherein the heatpipe is a vapor chamber.

21. The apparatus of claim 16, wherein one of the plurality of computer components is a die.

22. An apparatus, comprising:
a bracket having a raised area;
a heatpipe positioned against the raised area;
a thermal interface material positioned on the heat conductor;
a die positioned on the thermal interface material;
the die connected to a printed circuit board substrate;
a backing plate located under the printed circuit board substrate; and
one or more fasteners for attaching the plate to the backing plate wherein the raised area is capable of applying a centerpoint force to the heatpipe to provide a balanced compressive force to the die.

23. The apparatus of claim 22, wherein the bracket flexes as a spring.

24. The apparatus of claim 22, wherein the thermal interface material is a phase change thermal interface material.

25. A method of attachment, comprising:
positioning a plurality of computer components into a stack, wherein one computer component is a heatpipe;
applying one or more thermal interface materials between one or more of the plurality of computer components;
positioning a bracket having a raised area, over a top of the stack to contact the heatpipe;
positioning a backing plate under a bottom of the stack;
applying a centerpoint force to the heatpipe by attaching the bracket to the backing plate; and
creating a balanced clamping force to the one or more thermal interface materials.

26. The method of claim 25, wherein the raised area is a radius.

27. The method of claim 25, wherein one of the one or more thermal interface materials is a solder.

28. The method of claim 25, wherein one of the one or more thermal interface materials is an epoxy.

29. The method of claim 25, wherein one of the one or more thermal interface materials is a grease.

30. The method of claim 25, wherein at least one of the one or more thermal interface materials is a phase change material.

31. A method of attachment, comprising:
connecting a die to a printed circuit board;
applying a thermal interface material to the die;
positioning a heatpipe over the die;
positioning a bracket having a raised area, over the heatpipe;
positioning a backing plate under the printed circuit board substrate;
fastening the bracket to the backing plate; wherein
the bracket raised area applies a uniform clamping pressure to the die.

32. The method of claim 31, wherein the raised area applies a uniform clamping pressure to the thermal interface materials.

33. The method of claim 31, wherein the raised area applies a uniform clamping pressure to the mating surfaces of the heat conductor and the die.

34. A method of attachment, comprising;
connecting a die to a printed circuit board substrate;
applying a first thermal interface material to the die;
positioning a spreader plate over the first thermal interface material;
applying a second thermal interface material to the spreader plate;
positioning a heatpipe over the second thermal interface material;
positioning a bracket having a raised area, over the heatpipe;
positioning a backing plate under the printed circuit board substrate;
fastening the bracket to the backing plate; wherein the bracket raised area applies a uniform clamping pressure to the die.

35. The method of claim 34, wherein at least one of the thermal interface materials is a phase change thermal interface material.

36. An apparatus, comprising:
   a stack of computer components, comprising:
      a die,
      a vapor chamber,
      a thermal interface material in between,
      a backing plate fastened to a bracket with the stack of computer components in between, and
      the bracket comprising:
         a raised area positioned on the vapor chamber providing a single point compressive force that is centered over the die.

37. The apparatus of claim 34 wherein the thermal interface material is a phase change thermal interface material.

38. The apparatus of claim 36, wherein the raised area is a radius.

39. The apparatus of claim 36, wherein the raised area has a flat area that contacts the vapor chamber.

40. An apparatus, comprising:
   a bracket comprising:
      a raised area;
   a backing plate; with
      a plurality of computer components in between, including a vapor chamber, where each of the plurality of computer components has a surface area in contact with a mating computer component surface, and
      one or more attachment features, wherein the bracket is attached to the backing plate with the raised area of the bracket providing a center point force to the contact surface areas.

41. An apparatus, comprising:
   a bracket having a raised area;
   a heatpipe positioned against the raised area;
   a thermal interface material positioned on the heatpipe;
   a die positioned on the thermal interface material;
   the die connected to a printed circuit board substrate;
   a backing plate located under the printed circuit board substrate; and
   one or more fasteners for attaching the plate to the backing plate wherein the raised area applies a balanced compressive force to the die.

\* \* \* \* \*

UNITED STATES PATENT AND TRADEMARK OFFICE
CERTIFICATE OF CORRECTION

PATENT NO. : 6,469,893 B1
DATED : October 22, 2002
INVENTOR(S) : Frutschy et al.

It is certified that error appears in the above-identified patent and that said Letters Patent is hereby corrected as shown below:

Column 2,
Line 10, delete "recurred" and insert -- offered --.
Line 10, delete "on" and insert -- due --.

Column 5,
Line 67, delete "206" and insert -- 306 --.

Column 6,
Line 40, delete "bonded" and insert -- bent --.

Signed and Sealed this

Eighteenth Day of March, 2003

JAMES E. ROGAN
*Director of the United States Patent and Trademark Office*